US009983047B2

(12) United States Patent
Starinki et al.

(10) Patent No.: US 9,983,047 B2
(45) Date of Patent: May 29, 2018

(54) APPARATUSES AND METHODS FOR MONITORING STALL OF MOTORS

(71) Applicant: VENTURE MEASUREMENT COMPANY LLC, Spartanburg, SC (US)

(72) Inventors: Michael Starinki, Easley, SC (US); Christopher Hampton, Taylors, SC (US); Brian Jamieson, Simpsonville, SC (US)

(73) Assignee: VENTURE MEASUREMENT COMPANY, LLC, Spartanburg, SC (US)

(*) Notice: Subject to any disclaimer, the term of this patent is extended or adjusted under 35 U.S.C. 154(b) by 65 days.

(21) Appl. No.: 15/023,899

(22) PCT Filed: Sep. 24, 2014

(86) PCT No.: PCT/US2014/057250
§ 371 (c)(1),
(2) Date: Mar. 22, 2016

(87) PCT Pub. No.: WO2015/048156
PCT Pub. Date: Apr. 2, 2015

(65) Prior Publication Data
US 2016/0238432 A1 Aug. 18, 2016

Related U.S. Application Data
(60) Provisional application No. 61/883,115, filed on Sep. 26, 2013.

(51) Int. Cl.
H02P 8/38 (2006.01)
G01F 25/00 (2006.01)
(Continued)

(52) U.S. Cl.
CPC .............. *G01F 25/00* (2013.01); *G01F 23/22* (2013.01); *G01R 31/34* (2013.01); *H02P 6/182* (2013.01);
(Continued)

(58) Field of Classification Search
CPC ........................................................ H02P 8/38
(Continued)

(56) References Cited

U.S. PATENT DOCUMENTS 5,189,356 A * 2/1993 Rovner .............. G06K 7/10881
318/685
5,345,156 A * 9/1994 Moreira ................ D06F 37/304
318/400.04

(Continued)

FOREIGN PATENT DOCUMENTS

JP 2008005632 A 1/2008
JP 2009106092 A 5/2009

OTHER PUBLICATIONS

International Preliminary Report on Patentability and Written Opinion of the International Searching Authority;filed in PCT/US2014/057250; dated Apr. 7, 2016; 9 pgs.

Primary Examiner — David S Luo
(74) Attorney, Agent, or Firm — Moreno IP Law LLC

(57) ABSTRACT

A system and method for monitoring a level of material in a storage bin, including a gear train, a gear train shaft rotatably coupled to the gear train, a drive shaft, a coupling system to couple the gear train shaft to the drive shaft, a paddle coupled to the drive shaft to rotate in unison therewith, the paddle configured to engage a material in the storage bin when the level of material reaches a threshold level, and a stepper motor. A controller may be communi-
(Continued)

catively coupled to the stepper motor wherein the controller is configured to monitor the running state and the stall state of the stepper motor.

19 Claims, 12 Drawing Sheets

(51) Int. Cl.
*H02P 8/34* (2006.01)
*H02P 8/36* (2006.01)
*H02P 6/182* (2016.01)
*H02P 6/185* (2016.01)
*H02P 6/22* (2006.01)
*G01F 23/22* (2006.01)
*G01R 31/34* (2006.01)

(52) U.S. Cl.
CPC ............... *H02P 6/185* (2013.01); *H02P 6/22* (2013.01); *H02P 8/34* (2013.01); *H02P 8/36* (2013.01); *H02P 8/38* (2013.01)

(58) Field of Classification Search
USPC ................ 318/400.34, 400.32, 400.01, 700
See application file for complete search history.

(56) References Cited

U.S. PATENT DOCUMENTS

| | | | |
|---|---|---|---|
| 6,485,171 | B1 | 11/2002 | Wang et al. |
| 6,696,965 | B2 | 2/2004 | Stout et al. |
| 7,832,268 | B2 | 11/2010 | Morris |
| 8,049,449 | B2 * | 11/2011 | Okubo ............... B62D 5/046 318/400.01 |

* cited by examiner

APPARATUSES AND METHODS FOR MONITORING STALL OF MOTORS

BACKGROUND

Technical Field

The present disclosure relates to monitoring of motors, and more particularly for monitoring stall of motors used in connection with bin level indicators.

Description of the Related Art

Bin level indicators typically include a rotatable paddle structure extending into a bin and an electric motor. The electric motor may be contained within a protective enclosure and is connected to the rotatable paddle. The rotatable paddle is adapted to engage material within a storage bin when the material rises to the bin level at which the rotating paddle is disposed. Material drag on the paddle causes the motor drive torque to rotate the motor rather than the paddle, which rotation is sensed by one or more switches carried within the enclosure. The switches may be connected to deactivate a conveyor feeding material to the bin, to remove power from the indicator motor and/or to perform other control functions related to material level. In some instances, the indicator may be mounted at the bottom of the bin and will have its load released by emptying of the bin and again a signal system is actuated by the change in load on the motor.

Conventional bin level indicators may further require sensors, such as optical or magnetic sensors, to detect the motor's shaft rotation, fine pitch gears, springs, and/or complex clutch mechanisms. Requiring multiple complex components for proper functioning can increase the failure modes, add costs, and increase the complexity of the bin level indicators. Further, the material in the storage bin may have varying densities, detection of which may require adjusting paddle sizes to paddles of certain width and height to accurately detect material levels in bins. Still further, conventional bin level indicators may not differentiate between stalled paddles and gear or motor failures. By way of an example, a low level bin level indicator may remain in the stalled position until the level of material in the bin is fully empty, thus removing material drag on the paddle. However, an operator may not know if the low level bin level indicator has remained in the stalled position due to material level or due to a gear or motor failure.

BRIEF SUMMARY

Embodiments described herein provide apparatuses and methods that are well adapted to monitor the operating conditions of motors and rotatory equipment in a particularly accurate manner and in a compact and robust form factor. According to one embodiment, an apparatus for monitoring a level of material in a storage bin may be summarized as including a gear train; a gear train shaft rotatably coupled to the gear train; a drive shaft; a coupling system to couple the gear train shaft to the drive shaft; a paddle coupled to the drive shaft to rotate in unison therewith, the paddle configured to engage a material in the storage bin when the level of material reaches a threshold level; and a stepper motor. The coupling system may be configured to impart rotation motion between the gear train shaft and the drive shaft. The stepper motor may have a running state and a stall state, where the stepper motor is operatively coupled to the gear train to drive the gear train shaft to impart torque on the drive shaft and the paddle during the running state and the material engaging the paddle to cause the stepper motor to switch to the stall state.

According to another embodiment, an apparatus for monitoring a level of material in a storage bin may be summarized as including a gear train; a gear train shaft rotatably coupled to the gear train; a drive shaft; a coupling system to couple the gear train shaft to the drive shaft; a paddle coupled to the drive shaft to rotate in unison therewith, the paddle configured to engage a material in the storage bin when the level of material reaches a threshold level; a stepper motor; and a controller. The coupling system may be configured to impart rotation motion between the gear train shaft and the drive shaft. The stepper motor may have a running state and a stall state, where the stepper motor is operatively coupled to the gear train to drive the gear train shaft to impart torque on the drive shaft and the paddle during the running state and the material engaging the paddle to cause the stepper motor to switch to the stall state. The controller may be communicatively coupled to the stepper motor, where the controller is configured to monitor the running state and the stall state of the stepper motor.

According to another embodiment, a method for continually monitoring a running state and/or a stall state of a motor may be summarized as including measuring a duration of counter or back electromotive force (BEMF) during operation of a motor; and comparing the said duration with a respective threshold duration of BEMF of a running motor and a stalled motor, the said duration being higher than the threshold duration of the running motor when the motor is in the running state and being lower than the threshold duration of the stalled motor when the motor is in the stall state.

According to another embodiment, a method for monitoring a stall state of a motor for one of a variety of operating conditions may be summarized as including defining a threshold duration of BEMF for a range of stall torque values of a running motor and a stalled motor, where each stall torque value being proportional to a peak current of the motor and applicable to the respective operating condition; setting the stall torque value of the motor; measuring a sample duration of presence of BEMF during operation of the motor; and comparing the sample duration with the selected threshold duration of BEMF to determine the stall state of the motor. The comparison may be indicative of a stall state when the sample duration is lower than the threshold duration of the stalled motor and the comparison may be indicative of a running state when the sample duration is higher than the threshold duration of the running motor.

According to another embodiment, a method for detecting a defect in a gear train may be summarized as including rotating the motor in a direction counter to a direction of motor rotation during operation such that the gear train shaft disengages from the drive shaft through the coupling system and determining the stall state of the motor. Measuring the stall state at this time insures that the gear train is free to move in spite of the drive shaft's mobility. If the motor is in a stalled state during this instance, the gear train is deemed defective. If the motor is in a running state during this instance, the gear train is deemed operational.

According to another embodiment, a method for detecting a defect in a motor may be summarized as including rotating the motor in a direction counter to a direction of motor rotation during operation of the motor; measuring a sample duration of presence of a back electromotive force (BEMF)

for both windings during counter rotation of the motor; and comparing the sample durations with a threshold duration of a defective motor. The comparison may be indicative of the defective motor when the sample duration for either winding is lower than the threshold duration and the comparison may be indicative of an operational motor when the sample duration for both windings is higher than the threshold duration.

According to another embodiment, a method to monitor a fault in an apparatus for monitoring a level of material in a storage bin for one of a variety of operating conditions may be summarized as including defining a threshold duration of BEMF for a range of stall torque values of a running motor, with each stall torque value being proportional to a peak current of the motor and applicable to the respective operating condition; setting the stall torque value of the motor; measuring a sample duration of presence of BEMF during operation of the motor; and comparing the sample duration with the selected threshold duration of BEMF to determine if the apparatus has a fault. The comparison may be indicative of a fault in the apparatus when the sample duration is lower than the threshold duration of the running motor and the comparison may be indicative of an operational apparatus when the sample duration is higher than the threshold duration of the running motor.

DETAILED DESCRIPTION

The following detailed description is directed toward apparatuses and methods for use in connection with monitoring the operating condition of motors and rotating equipment. The description and corresponding figures are intended to provide an individual of ordinary skill in the art with enough information to enable that individual to make and use embodiments of the invention. Such an individual, however, having read this entire detailed description and reviewed the figures, will appreciate that modifications can be made to the illustrated and described embodiments, and/or elements removed therefrom, without deviating from the spirit of the invention. It is intended that all such modifications and deviations fall within the scope of the invention, to the extent they are within the scope of the associated claims.

Unless the context requires otherwise, throughout the specification and claims which follow, the word "comprise" and variations thereof, such as, "comprises" and "comprising" are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Figure 1:
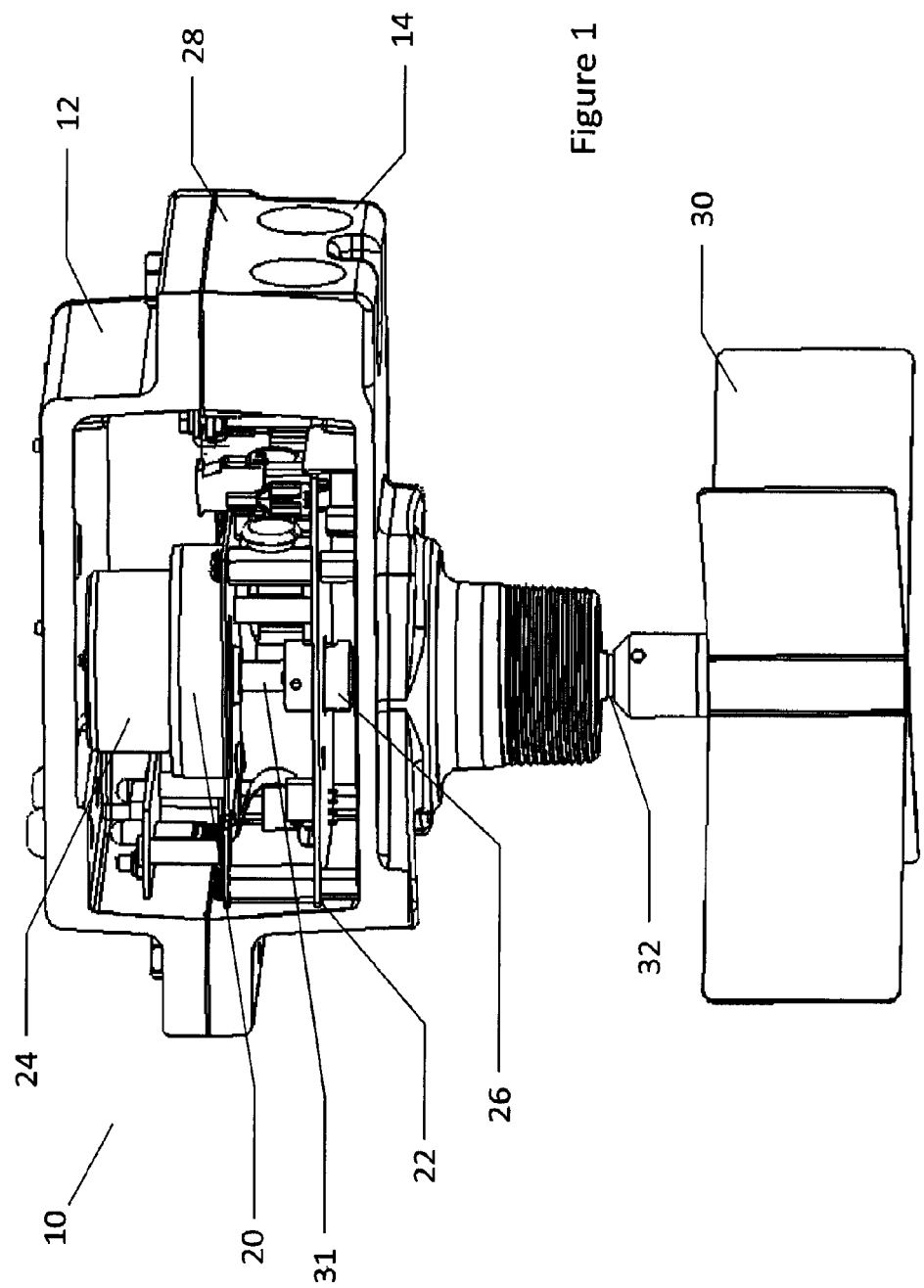
FIG. 1 is a partial cutaway perspective view of an apparatus to detect material level in a storage bin, according to one embodiment.

FIG. 1 illustrates an apparatus 10 for detecting material storage in a bin, such as a tank, hopper, silo, or other structures. The apparatus 10 includes a housing 28 that is formed by coupling an upper cover 12 to a lower base 14. The apparatus 10 may further include a sealing structure, such as a gasket, sandwiched between the upper cover 12 and the lower base 14, to provide a substantially sealed apparatus 10. Within the housing 28, the apparatus 10 includes a gear train 20, a stepper motor 24, and an electronic controller 22. The stepper motor 24 may be a permanent magnet, variable reluctance, hybrid reluctance, or other type of a stepper motor. The electronic controller 22 may include a microcontroller and a stepper motor driver to control and drive the stepper motor 24 in a known manner. Moreover, the microcontroller may comprise a microprocessor, memory, and a plurality of peripheral devices to form a system on a chip that may be applicable for a wide variety of applications.

More generally, a control system that operates the embodiments of the apparatuses and methods described herein may include, without limitation, one or more computing devices, such as processors, microprocessors, digital signal processors (DSP), application-specific integrated circuits (ASIC), and the like. To store information, the control system may also include one or more storage devices, such as volatile memory, non-volatile memory, read-only memory (ROM), random access memory (RAM), and the like. The storage devices can be coupled to the computing devices by one or more buses. The control system may further include one or more input devices (e.g., displays, keyboards, touchpads, controller modules, or any other peripheral devices for user input) and output devices (e.g., displays screens, light indicators, and the like). The control system can store one or more programs for processing any number of different apparatuses and methods according to various embodiments described herein to detect the operating conditions of a motor. The control system, according to one embodiment, may be provided in the form of a general purpose computer system. The computer system may include components such as a CPU, various I/O components, storage, and memory. The I/O components may include a display, a network connection, a computer-readable media drive, and other I/O devices (a keyboard, a mouse, speakers, etc.). A control system manager program may be executing in memory, such as under control of the CPU, and may include functionality related to detecting the running and stall states of the motors described herein.

It should further be noted that the control system may include one or more sensors for determining various operating parameters of the apparatus such as temperature, humidity, vibration, etc. These sensors are able to collect data and store the information within the apparatus or transmit the data to a data collection system outside of the apparatus. For example, the apparatus may also include a wired or wireless transmission system for enabling the sensor data or operating conditions of the apparatus to be transmitted to a storage or processing device remote from the apparatus. Such remote devices may include on-site data processing systems or cloud computing storage for remote data processing.

With continued reference to FIG. 1, the gear train 20 may include two or more gears rotatably engaged with each other. Further, the gear train 20 is rotatably coupled to a gear train shaft 31 that extends downwardly from the gear train 20 and is coupled to a drive shaft 32 through a coupling system 26, which is discussed in more detail elsewhere. While the illustrated embodiment includes a gear train 20, in alternate embodiments, other means or drive mechanisms may be used instead, such as a belt drive system, pulleys, sprockets, or similar systems, which may connect a motor shaft to a drive shaft and transmit power.

At a bottom end, the drive shaft 32 is fixedly coupled to a paddle 30, such that the paddle rotates in unison with the drive shaft 32. In operation, the drive shaft 32 extends into a storage bin and the stepper motor 24 drives the drive shaft 32, thus enabling the paddle 30 to rotate freely. However, as the paddle 30 engages material in the storage bin, the rotational resistance of the material will result in a counteracting torque, causing the stepper motor 24 to stall. Such material may include, for example, feed, silica sand, rocks, pellets, wood, calcium dust, rubber, metals, regrind materials, coal, peanuts, malt, clay resin, limestone, grain, foundry materials, sand pre-mix, rawhide, sawdust, and other materials.

Use of the stepper motor 24 in the manner described in further detail elsewhere can advantageously detect this stall condition. In stepper motors, the stall torque can be defined as being directly proportional to the peak current. By way of an example, the following equation can be used to show this relationship:

$$T = \left(\frac{PN}{2\pi}\right)\phi I$$

where T is torque; P is number of poles; N is number of coil turns; Φ is flux; and I is current. In the embodiment illustrated in FIG. 1, the peak current, which is the highest current a motor will produce, can be adjusted to determine the stall torque of the apparatus 10. By way of an example, the microcontroller of the electronic controller 22 may be used to measure the peak current. Thus, changing the peak current to various values, the stall torque of the motor may then be determined. Moreover, the stall torque may then be appropriately manipulated to suit a wide variety of applications. For example, in some embodiments, the electronic controller 22 may be electrically coupled to a potentiometer, DIP switches, jumpers or other means to create an adjustable voltage divider or the like, which the electronic controller 22 can read to control the stall torque by adjusting the current thresholds.

Figure 2:
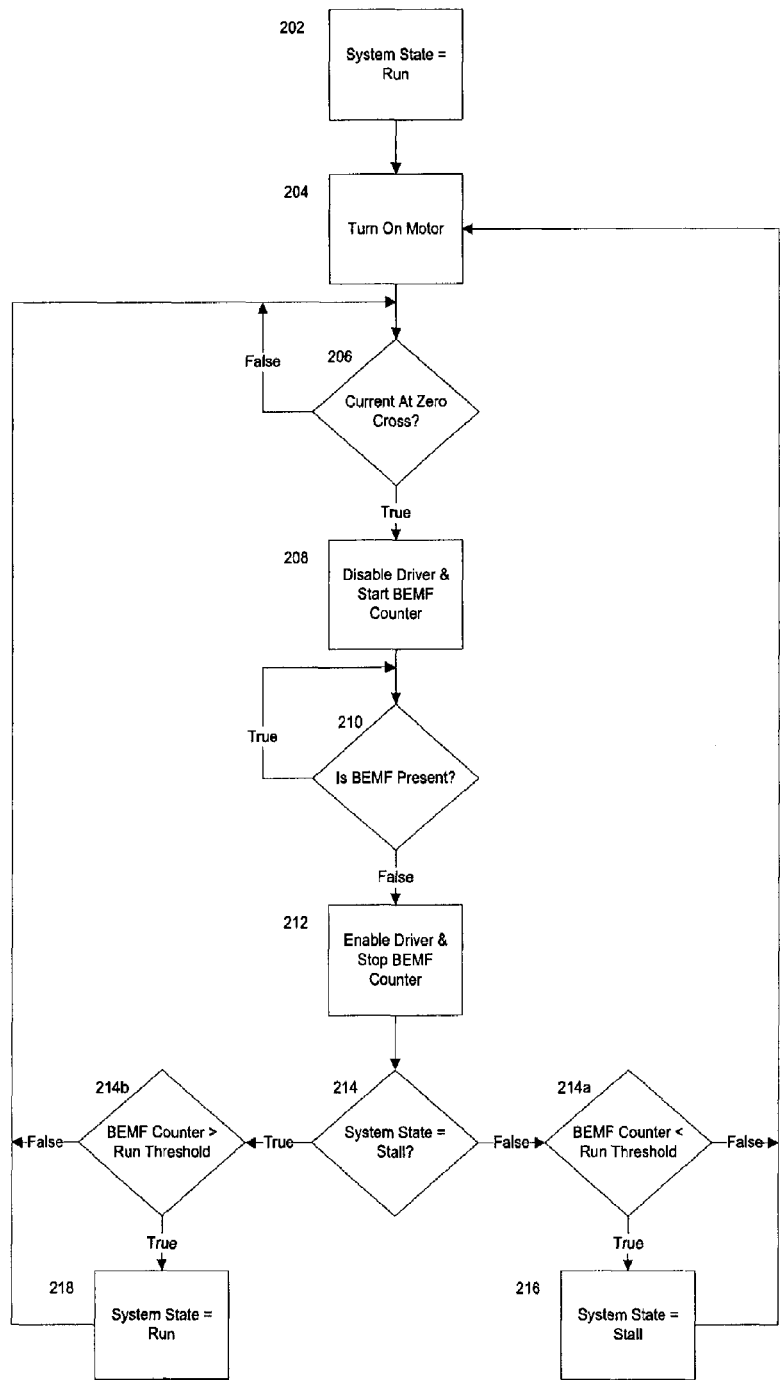
FIG. 2 is a flow diagram of a method to detect stall of a motor, according to one embodiment.

FIG. 2 illustrates a method 200 to detect a stepper motor 24 that has been stalled or is in a running state, according to one embodiment. In stepper motor 24, the current supplied to a coil sitting in a magnetic field causes it to turn. As the coil of the motor rotates, it experiences a change in magnetic flux with time and by Faraday's Law an electromotive force (EMF) is induced in the coil. As explained by Lenz's Law this induced EMF must oppose the supplied EMF driving the coil. This induced EMF is known as a counter or back EMF (BEMF) and is represented as a voltage induced across the motor windings when the motor driver is momentarily disabled. Throughout this specification, the terms "counter electromotive force" and "back electromotive force" may be used interchangeably. The BEMF can be defined as being directly proportional to the angular velocity of the stepper motor 24. Thus, as a load is applied to the stepper motor 24, the angular velocity will decelerate faster and thus reduce the duration of the presence of the BEMF. The method 200 advantageously allows for using the BEMF duration measurements to determine whether the stepper motor 24 is stalled or running without using any electro-mechanical means, such as optical or mechanical sensors, clutch or spring mechanisms, or the like.

In step 202, the motor is in a run state and turns the stepper motor 24 on at 204. At step 206, the motor coil or drive current is at zero-cross and the BEMF is measured. The motor 24 drive current at zero-cross, i.e., where the motor 24 drive current is at its lowest value, provides an advantageous point to measure the duration of the BEMF because the duration of the BEMF is the longest at this point in an unloaded condition. If the motor 24 drive current is at the zero-cross point at step 206, the motor driver is disabled and a BEMF counter is initiated at step 208. Thereafter, at step 210, the presence of BEMF is measured. BEMF may be measured by including a comparator electrically coupled to the electronic controller 22, or other similar means to compare voltage inputs. The comparator may compare the BEMF voltage $V_{BEMF}$ to a pre-set Voltage threshold $V_{Threshold}$ and send an output signal to the electronic controller 22 when the $V_{BEMF}$ exceeds the $V_{Threshold}$ to initiate the BEMF counter. Once initiated, the BEMF counter continues the duration count until BEMF is no longer present, i.e., when $V_{BEMF}$ drops below the $V_{Threshold}$, and at step 212 enables the motor driver and stops the BEMF counter. At step 214, whether the motor is in a stall or run state is determined. At step 214a, if the BEMF counter is less than a pre-set motor stall threshold value, then the motor is determined to be in a stall state at step 216. On the other hand, at step 214b, if the BEMF counter is greater than the pre-set motor run threshold, then the motor is determined to be in a run state at step 218.

Figure 3:
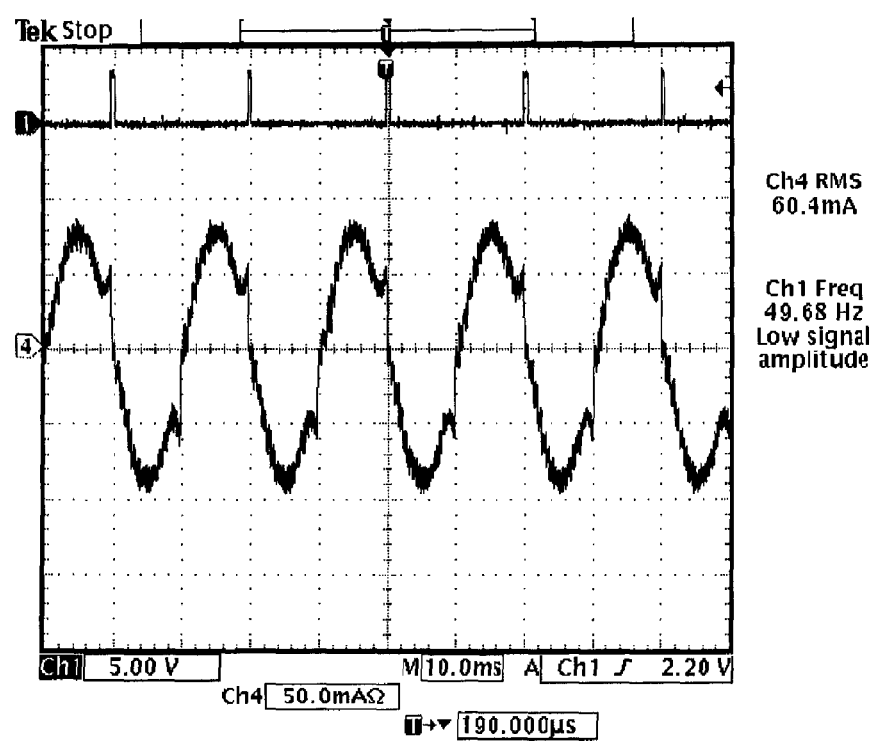
FIG. 3 is a graph illustrating a winding current waveform of an unloaded motor.
Figure 4:
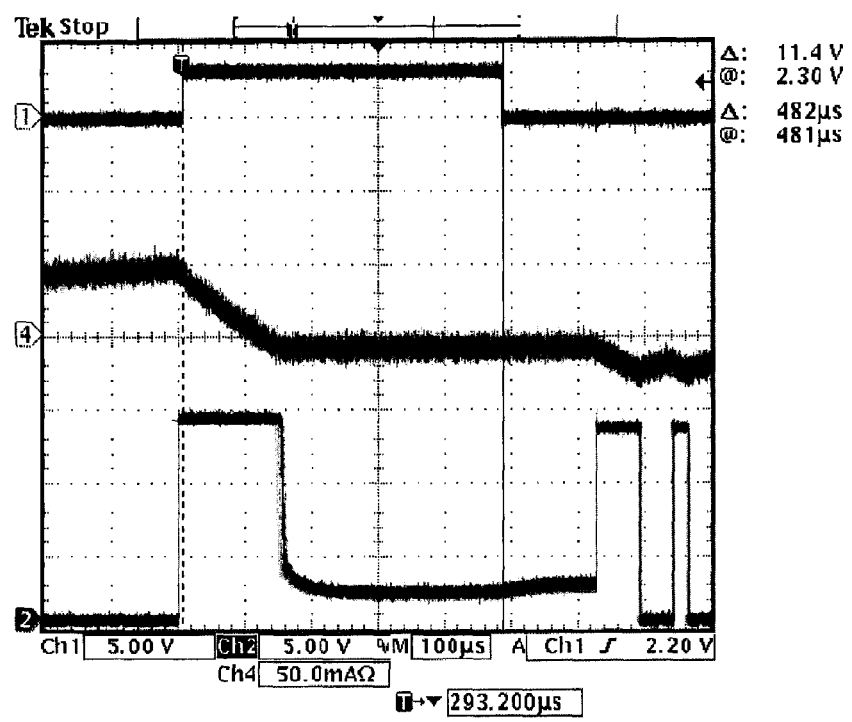
FIG. 4 is a graph illustrating an electrical waveform of a running motor.
Figure 5:
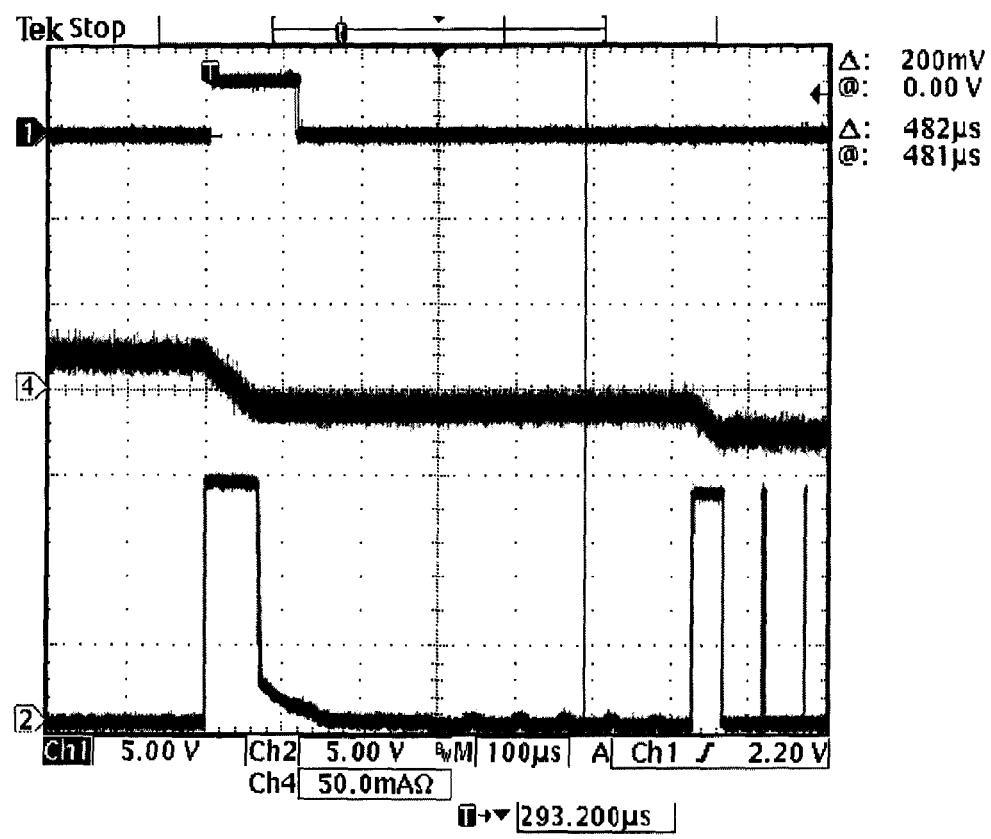
FIG. 5 is a graph illustrating an electrical waveform of a stalled motor.

FIGS. 3 to 5 illustrate oscilloscope traces of electrical waveforms generated at various states of the motor. FIG. 3 illustrates the current waveform of an unloaded motor, and shows a short pulse at the zero cross of the waveform, thus indicating the point at which the BEMF measurement is taken. As discussed previously, this is the point at which the longest duration of BEMF is observed. FIGS. 4 and 5 illustrate electrical waveforms when the motor is running and stalled, respectively. As observed from the traces of channel 1 in FIGS. 4 and 5, when the motor is temporarily disabled, the duration of the BEMF is reduced when the motor is in the stalled state due to the load being applied to the motor. Using the method 200 can advantageously detect this condition, which may be caused by load on the motor, such as material build-up on the paddle 30, gear fatigue, deterioration of the motor performance, and other failure modes, and can be communicated to a user through a user interface by use of indicators, such as an audible alarm, a buzzer, a gauge, a light emitting diode (LED), or other similar indicators. Using the method 200 described above can advantageously provide for detection of stalled motors at a wide range of stall torque levels.

Figure 6:
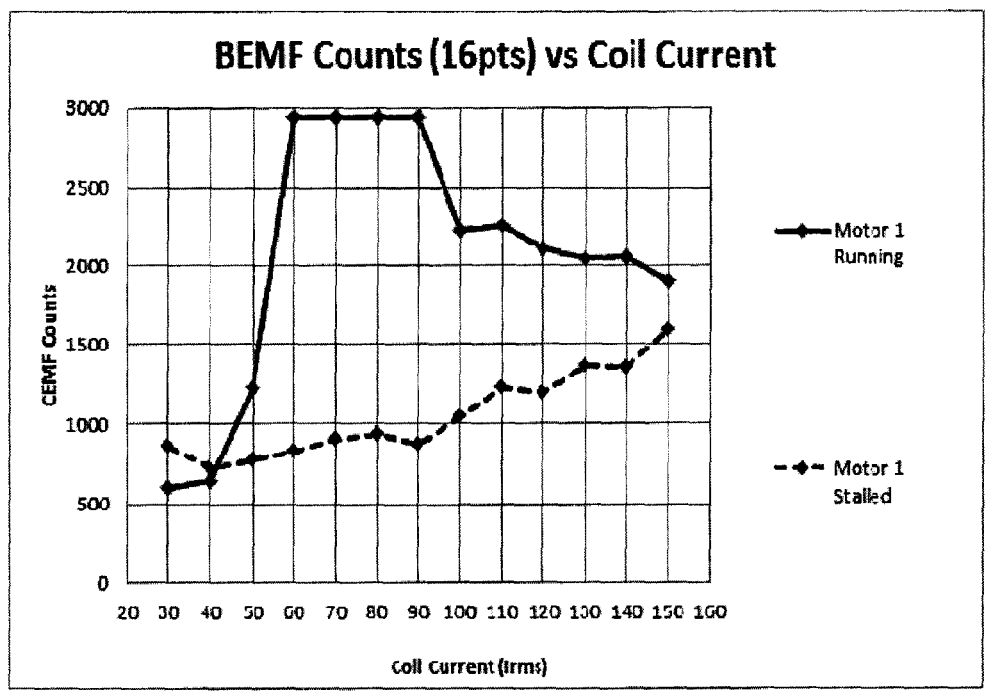
FIG. 6 is a graph illustrating a relationship between Back Electromotive Force (BEMF) counts/duration and stall torque values for a running and a stalled motor.

FIG. 6 illustrates a plot of coil current versus BEMF counts for a running motor and a stalled motor. As explained in more detail elsewhere, the peak motor 24 drive current may be directly proportional to the stall torque; thus, the stall torque may be controlled by adjusting the peak motor 24 drive current. As illustrated in FIG. 6, the BEMF counts of a running motor is generally higher than the BEMF counts of a stalled motor across a wide range of peak motor 24 drive current values. Thus, the BEMF thresholds for determining whether the motor is running or stalled can be pre-set for a wide range of peak motor 24 drive currents and can be advantageously used for a wide variety of applications. By way of an example, using the method 200, the rotatable paddle 30 may detect lower density materials or higher density materials by reducing or increasing the stall torque values, respectively, and monitoring whether the BEMF duration measurements are less than the motor run threshold and/or the motor stall threshold. In other embodiments, the pre-set BEMF threshold may be defined over a set of stall torque values, such as by defining a high, medium, and low range covering for the densities of material likely to be received by the storage bins.

Figure 7:
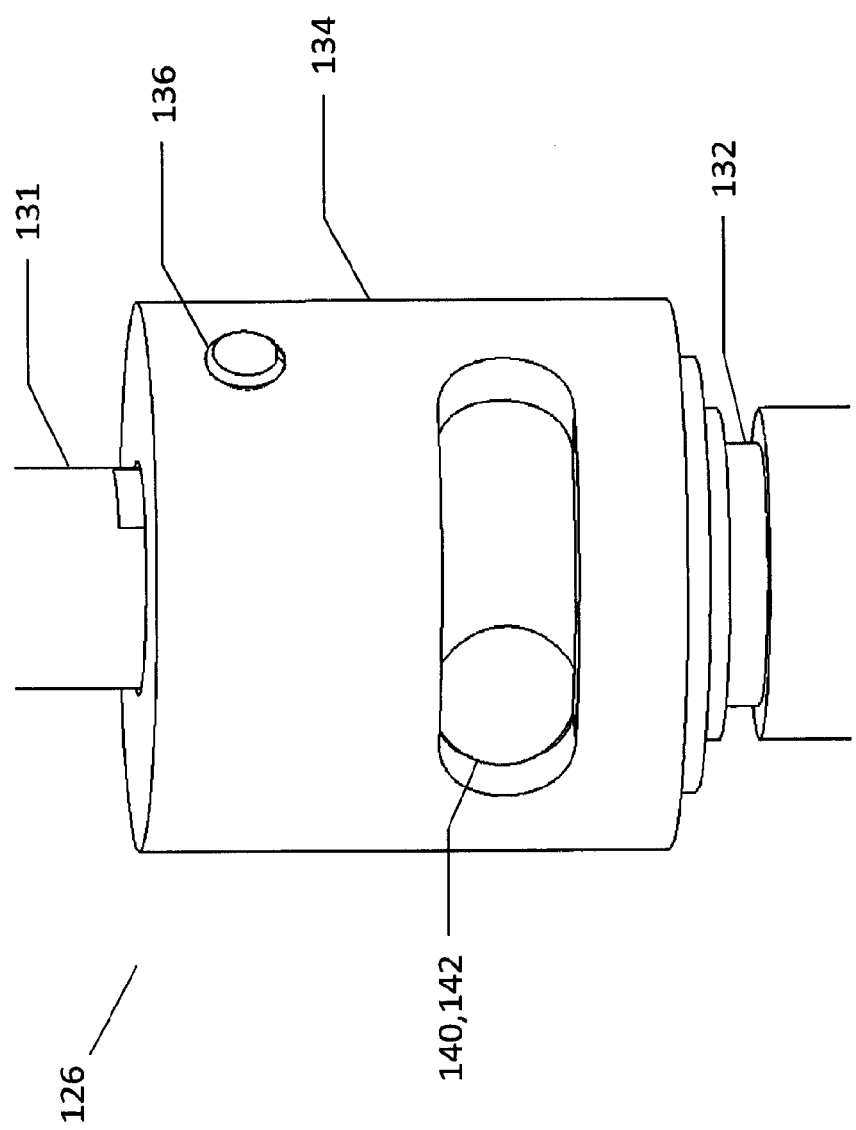
FIG. 7 is a detail perspective view of a coupling system, according to a second embodiment.
Figure 8:
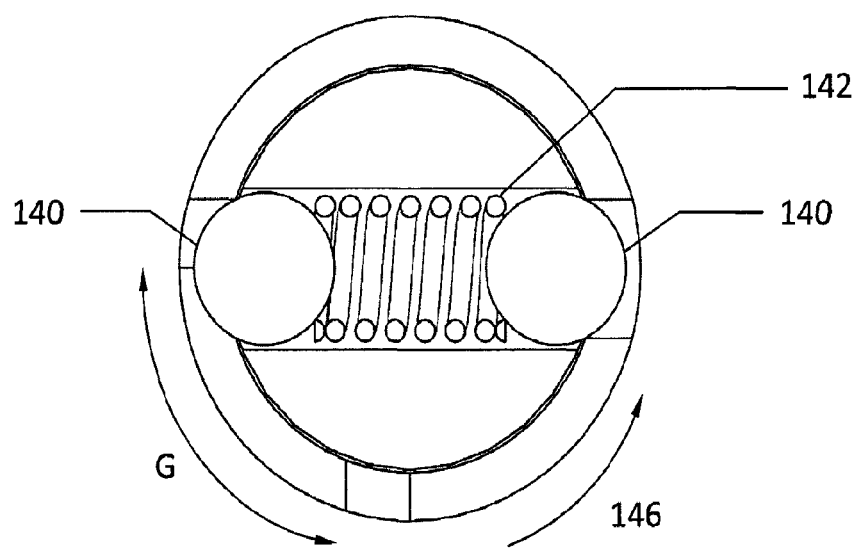
FIG. 8 is a top elevation perspective view of the coupling system of FIG. 7, illustrating the motor in a running state.
Figure 9:
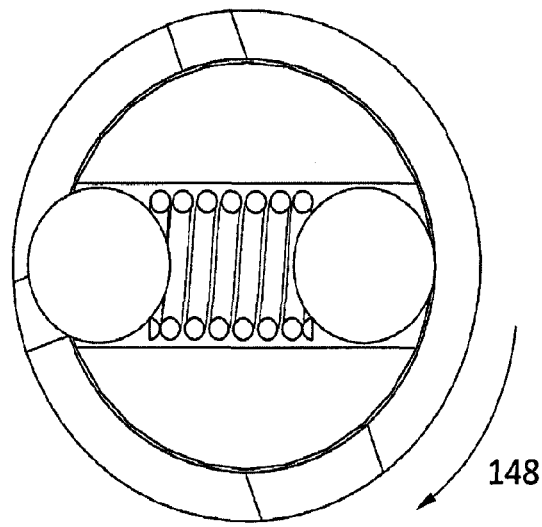
FIG. 9 is a top elevation perspective view of the coupling system of FIG. 7, illustrating the motor in a test condition.

FIGS. 7-9 illustrate the coupling system 126 that transmits rotational energy to drive the rotatable paddle 30. The coupling system includes a slotted gear train shaft 131, a clutch housing 134, a drive shaft 132, c-pin 136, spring 142, and two bearings 140. The slotted gear train shaft 131 fits into one end of the clutch housing 134 such that the slot mates with a c-pin 136, pressed into the clutch housing 134 allowing for the direct transmission of torque. The opposite end of the clutch housing 134 includes a slotted opening on one side and a hole on the other. The drive shaft 132 includes an opening in which a spring 142 and two bearings 140 are seated. The drive shaft 132 is rotatably coupled to the clutch housing 134, through the interlocking of the bearings 140, held in place by the spring 142 due to the applied spring force.

As best illustrated in FIG. 8, torque transmission between the clutch housing 134 and the drive shaft 132 is achieved through the spring 142 force acting on both bearings 140. When the gear train shaft 131 is turning in the direction of 146, the drive shaft 132 can achieve a torque proportional to the force acting between both bearings 140 and the clutch housing 134. As the torque applied by the geartrain through the clutch 134 to a secured drive train shaft 132 is increased, the bearings 140 are forced into the clutch housing 134, disengaging the clutch housing 134 and allowing the geartrain shaft 131 to rotate without load for 180 degrees of rotation.

Moreover, a gap G' exists in the clutch housing 134 due to the slotted opening on one side. The gap in this embodiment is 90 degrees, in alternative embodiments this gap may range between 5 to 135 degrees. Providing this gap allows the geartrain to disengage from the clutch housing 134 at a lower torque when driven in the reverse direction 148, as illustrated in FIG. 9, which may assist in detecting if the gear train is defective, if the motor windings are damaged, or if the motor connector has been improperly installed, among other possible faults with the motor and gear train.

Figure 10:
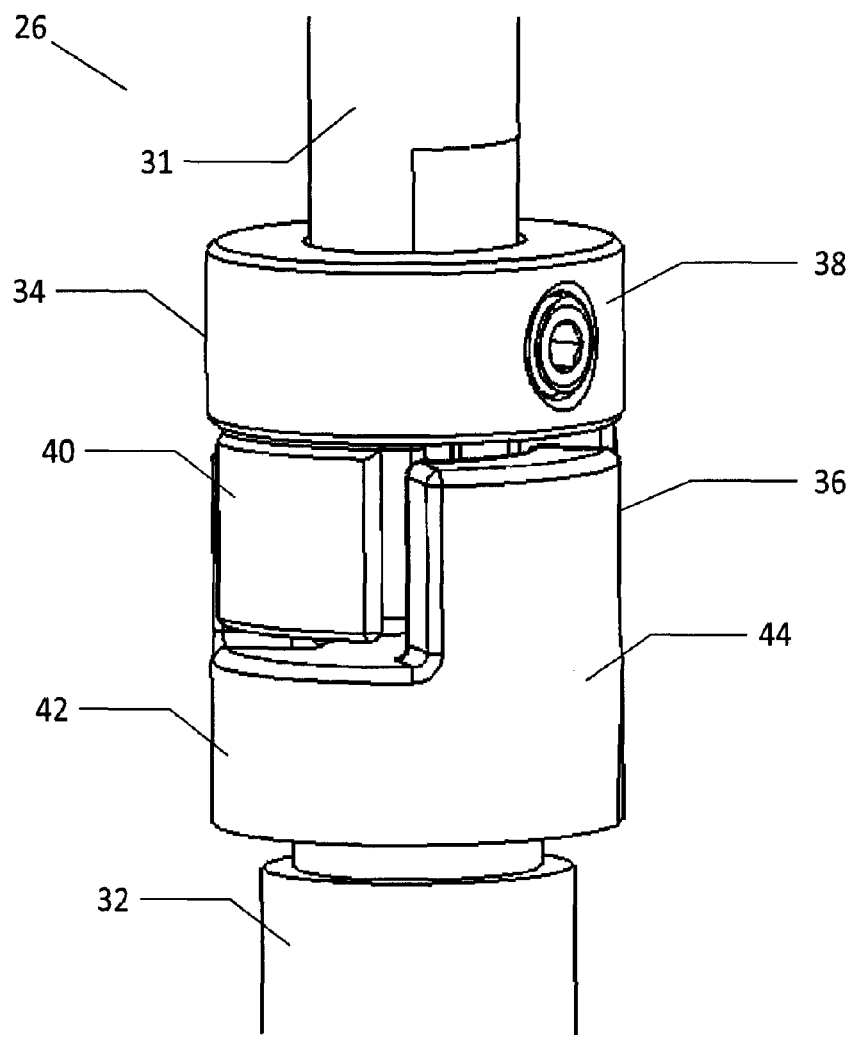
FIG. 10 is a detail perspective view of an alternate coupling system, according to one embodiment.
Figure 11:
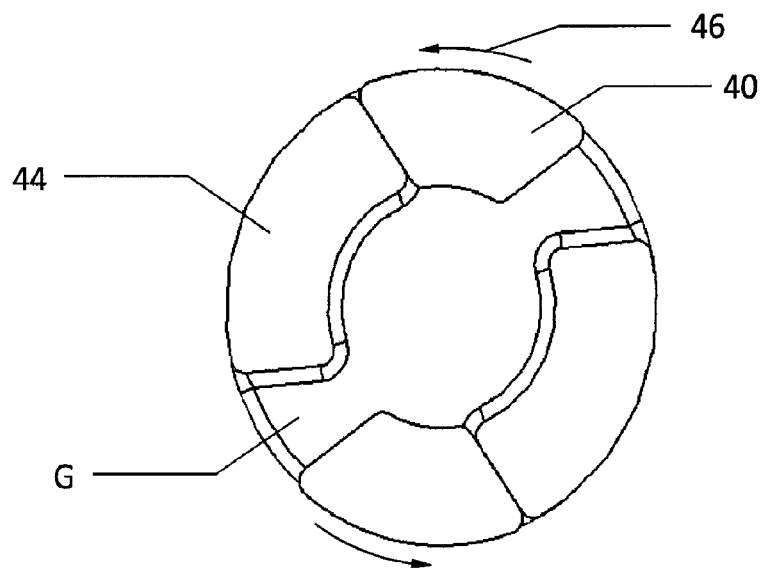
FIG. 11 is a top elevation perspective view of the alternate coupling system of FIG. 10, illustrating the motor in a running state.
Figure 12:
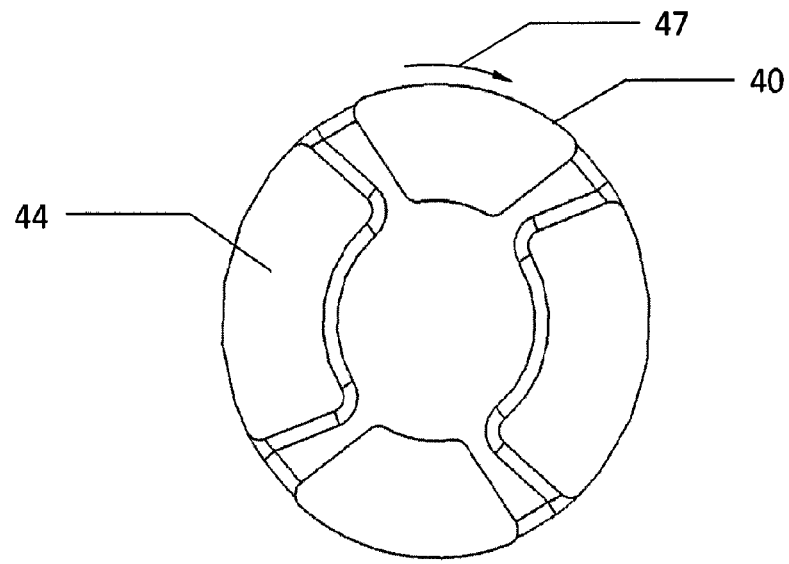
FIG. 12 is a top elevation perspective view of the alternate coupling system of FIG. 10, illustrating the motor in a test condition.

An alternate embodiment of the coupling system is illustrated in FIGS. 10-12, wherein the coupling system 26 transmits rotational energy to drive the rotatable paddle 30. The coupling system 26 includes a gear train coupler 34 and a drive shaft coupler 36. The gear train coupler 34 includes a first half main body 38 and a pair of gear train coupler jaws 40 axially projecting from the first half main body 38, each jaw 40 being positioned opposite to the other. The drive shaft coupler 36 includes a second half main body 42 and a pair of drive shaft coupler jaws 44 axially projecting from the second half main body 42. The first half main body 36 is rotatably coupled to the gear train shaft 31 and the second half main body 42 is rotatably coupled to the drive shaft 32. As best illustrated in FIG. 11, the gear train coupler jaws 40 and the drive shaft coupler jaws 44 are spaced apart such that when the motor is running in the direction 46, the drive shaft 32 rotates when the gear train coupler jaws 40 interdigitate with the drive shaft coupler jaws 44.

Moreover, a gap G exists between the gear train coupler jaws 40 and the drive shaft coupler jaws 44. While the gap G shown in the embodiment is 30 degrees, in alternative embodiments, this gap may range between 5 to 60 degrees. Providing this gap G can advantageously allow for reversing the direction of the motor for a short duration 47, as illustrated in FIG. 12, which may assist in detecting if the gear train is defective, if the motor windings are damaged, or if the motor connector has been improperly installed, among other possible faults with the motor and gear train.

Figure 13:
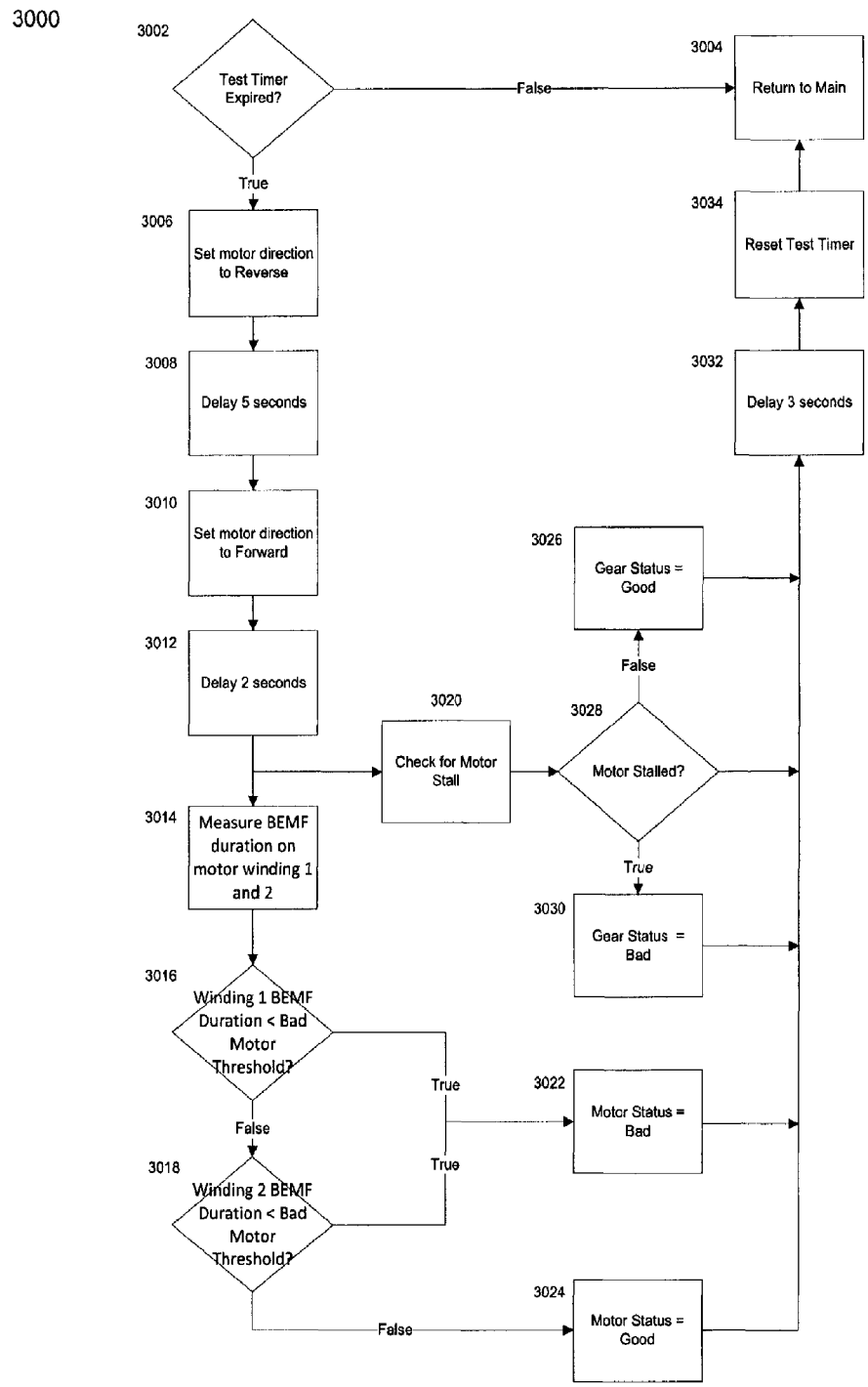
FIG. 13 is a flow diagram of a method to detect a defective motor and/or a defective gear train, according to a second embodiment.

FIG. 13 illustrates an exemplary method 3000 to detect defective gear trains and/or proper functioning of the motor. A test timer may be pre-set to run motor tests at appropriate time intervals. At step 3002, it is determined whether the test timer has expired. If the timer has not expired, the motor continues its normal operation at step 3004. If the timer has expired, the motor is set to rotate in a reverse direction at step 3006. The motor remains in the reverse direction for the duration specified by step 3008. At step 3010, the motor is set to rotate in a forward direction. After the delay specified in step 3012, the system performs a stall check in step 3020 and determines in step 3028 whether the motor is stalled. If the motor is found to have stalled then the system indicates a fault condition of the gear status in step 3030. If a stall condition is not found, then the gear status is determined to be correctly operational in step 3026. After gear status has been determined, a delay is initiated in step 3032 for a predetermined duration, the test timer is reset in step 3034 and the system returns to normal operation in step 3004.

In addition to, or contemporaneously with, the stall check, the duration of BEMF on both motor windings is measured in step 3014. In steps 3016 and 3018, coil BEMF duration is compared against a bad motor threshold reference value. If one or both of the duration values is below the threshold value, then motor is determined to be defective in step 3022. If both the BEMF counters are greater than the bad motor threshold, the motor is considered to be fully operational at step 3024. After motor status has been determined, there is a delay in step 3032, the test timer is reset in step 3034 and the system returns to normal operation in step 3004.

Figure 14:
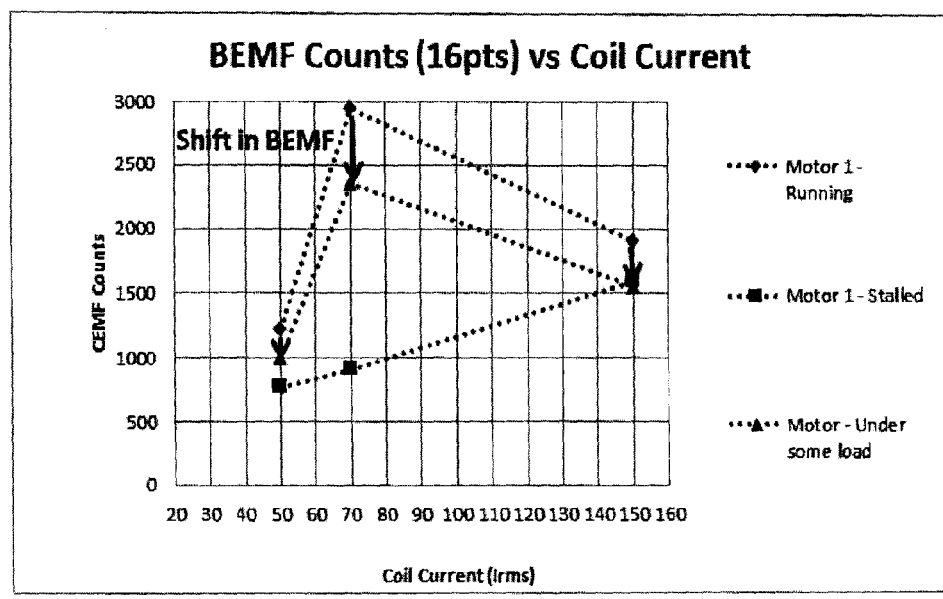
FIG. 14 is a graph illustrating a relationship between BEMF counts for varying torques for a running motor, a stalled motor, and when a monitoring system includes additional faults.

The methods described above may also be advantageously used to detect additional faults in the operation of the apparatus 10, such as material build-up on the paddle 30, wear on the gear train 20, decline in electronic performance of the motor 24, wear on a motor 24 bearing, and/or wear on a shaft bearing. Such conditions will add additional torque to the drive shaft, thus reducing the BEMF duration count in the manner described previously. FIG. 14 illustrates a plot of motor 24 coil current versus BEMF counts for a running motor, a motor under additional load, and a stalled motor across a wide range of peak motor 24 currents. As illustrated in FIG. 14, when additional load is added to the drive shaft, the BEMF duration count shifts downwardly, reflecting a reduction in the count. Thus, the methods described above may include additional checks to compare the BEMF duration counts with a reduced count caused by conditions that may increase the torque of the drive shaft. Upon discovery of such conditions, means to indicate this information to a user may be used through a user interface in a known manner; such means may include an audible alarm, a buzzer, a gauge, a light emitting diode (LED), or other similar indicators.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An apparatus for monitoring a level of material in a storage bin, the apparatus comprising:
    a gear train;
    a gear train shaft rotatably coupled to the gear train;
    a drive shaft;
    a coupling system to couple the gear train shaft to the drive shaft, the coupling system configured to impart rotation motion between the gear train shaft and the drive shaft;
    a paddle coupled to the drive shaft to rotate in unison therewith, the paddle configured to engage a material in the storage bin when the level of material reaches a threshold level;
    a stepper motor having at least two states of operation, the stepper motor operatively coupled to the gear train to drive the gear train shaft to impart torque on the drive shaft and the paddle during a first state of operation and the material engaging the paddle to cause the stepper motor to switch to a second state of operation; and
    a controller communicatively coupled to the stepper motor for monitoring the state of the stepper motor.

2. The apparatus of claim 1 wherein the controller is configured to variably control torque being output by the stepper motor.

3. The apparatus of claim 1 further comprising a microcontroller for comparing a back electromotive force (BEMF) voltage of a motor with one or more additional reference voltages and generating at least one corresponding output signal.

4. The apparatus of claim 3 wherein the microcontroller disables a motor driver when the BEMF comparison indicates that the motor is in a stalled condition.

5. The apparatus of claim 3 wherein the microcontroller processes the output signals to compare the BEMF duration count with a respective BEMF duration threshold of a running motor and a stalled motor, the comparison indicating a running motor when the BEMF duration count is higher than the BEMF duration threshold of the running motor and the comparison indicating a stalled motor when the BEMF duration count is lower than the BEMF duration threshold of the stalled motor.

6. The apparatus of claim 1 wherein the coupling system includes a gear train shaft inserted into a clutch, the clutch rotatably coupled to the drive shaft, the gear shaft engaging the drive shaft for imparting torque in a direction of rotation of the stepper motor.

7. The apparatus of claim 6 wherein the gear train coupler and the drive shaft coupler are spaced apart by an angular gap there between, the angular gap allowing a rotation of the gear train shaft in a direction counter to the rotation of the stepper motor to allow running of system diagnostic tests.

8. The apparatus of claim 6 wherein the gear train shaft is configured to be uncouplable from the clutch to enable the gear train shaft to rotate without load for a predetermined degree of rotation.

9. A method for monitoring an operational state of a motor in one of a variety of operating conditions, the method comprising:
    measuring a duration of presence of a back electromotive force (BEMF) during operation of a motor;
    comparing the duration with a respective threshold duration of BEMF of the motor in one or more operating states; and
    determining a stall or running state of the motor, wherein the duration is higher than a threshold duration of a running motor when the motor is in running state and is lower than a threshold duration of a stalled motor when the motor is in the stall state.

10. A method for monitoring an operational state of a motor in one of a variety of operating conditions, the method comprising:
    measuring a duration of presence of a back electromotive force (BEMF) during operation of a motor;
    comparing the duration with a respective threshold duration of BEMF of the motor in one or more operating states; and
    detecting a defect in the motor by comparing the duration with a threshold duration of BEMF of a defective motor for both motor windings, the comparison indicative of the defective motor when the duration is lower than the threshold duration and the comparison indicative of an operational motor when the duration is higher than the threshold duration.

11. A method for monitoring an operational state of a motor in one of a variety of operating conditions, the method comprising:
    measuring a duration of presence of a back electromotive force (BEMF) during operation of a motor;
    comparing the duration with a respective threshold duration of BEMF of the motor in one or more operating states; and
    identifying the particular operating state of the motor, wherein measuring the duration further comprises,
    detecting a motor drive current at a zero-cross point;
    disabling a motor driver of a motor controller;
    initiating a BEMF counter to measure the duration of the BEMF; and
    terminating the BEMF counter when a BEMF voltage drops below a BEMF threshold voltage of the motor.

12. A method for monitoring an operational state of a motor in one of a variety of operating conditions, the method comprising:
  measuring a duration of presence of a back electromotive force (BEMF) during operation of a motor;
  comparing the duration with a respective threshold duration of BEMF of the motor in one or more operating states; and
  defining a threshold duration of BEMF for a range of stall torque values of a running motor and a stalled motor, each stall torque value being proportional to a peak current of the motor and applicable to the respective operating condition.

13. The method of claim 12 wherein the range of stall torque values correspond to a respective density of a material being monitored in a storage bin, the stall torque being proportional to the density of the material.

14. A method to monitor a fault in an apparatus for monitoring a level of material in a storage bin for one of a variety of operating conditions, the method comprising:
  defining a threshold duration of BEMF for a range of stall torque values of a running motor, each stall torque value being proportional to a peak current of the motor and applicable to the respective operating condition;
  setting the stall torque value of the motor;
  measuring a sample duration of presence of BEMF during operation of the motor; and
  comparing the sample duration with the selected threshold duration of BEMF to determine if the apparatus has a fault, the comparison indicative of a fault in the apparatus when the sample duration is lower than the threshold duration of the running motor and the comparison indicative of an operational apparatus when the sample duration is higher than the threshold duration of the running motor, wherein the fault in the apparatus causes additional torque applied to the motor.

15. The method of claim 14 wherein the fault includes at least one of a material build-up on a paddle of a bin level indicator, wear on a gear train, wear on a motor bearing, and wear on a shaft bearing.

16. The method of claim 15 further includes the step of providing perceivable notification of the fault.

17. The method of claim 16 wherein the notification step includes transmitting the notification to a remote location.

18. A method for detecting the presence of a defect in a gear train comprising:
  setting a motor direction to reverse and determining whether the motor moves in the reverse direction;
  setting a motor direction to forward and determining whether the motor moves in the forward direction;
  determining from the movement of the motor whether the motor is in a stalled condition; and
  diagnosing the health of the gear train based on whether the motor is in the stalled condition.

19. The method of claim 18, wherein the stalled condition of the motor indicates the gear train is defective.

* * * * *